(12) United States Patent
Fujihara et al.

(10) Patent No.: US 7,323,848 B2
(45) Date of Patent: Jan. 29, 2008

(54) BATTERY CHARGING STATE ARITHMETIC OPERATION DEVICE FOR CALCULATING CHARGING STATE OF BATTERY, AND BATTERY CHARGING STATE ARITHMETIC OPERATION METHOD

(75) Inventors: Shinji Fujihara, Hyogo (JP); Kiyoharu Anzai, Tokyo (JP); Motoshi Kiribayashi, Kyoto (JP); Makoto Wanezaki, Kyoto (JP); Hideji Nakamura, Kyoto (JP); Toshiaki Hayashi, Kyoto (JP)

(73) Assignees: Japan Storage Battery Co., Ltd., Kyoto (JP); Mitsubishi Denki Kabushiki Kaisha, Tokyo (JP)

( * ) Notice: Subject to any disclaimer, the term of this patent is extended or adjusted under 35 U.S.C. 154(b) by 337 days.

(21) Appl. No.: 10/538,268

(22) PCT Filed: Dec. 11, 2003

(86) PCT No.: PCT/JP03/15842

§ 371 (c)(1),
(2), (4) Date: Jun. 10, 2005

(87) PCT Pub. No.: WO2004/053510

PCT Pub. Date: Jun. 24, 2004

(65) Prior Publication Data

US 2006/0055374 A1    Mar. 16, 2006

(30) Foreign Application Priority Data

Dec. 11, 2002  (JP)  .............................. 2002-359718
Jul. 24, 2003  (JP)  .............................. 2003-279466

(51) Int. Cl.
*H01M 10/46* (2006.01)

(52) U.S. Cl. .................................................. 320/132

(58) Field of Classification Search ................ 320/132, 320/149; 340/636.1, 636.12, 636.19, 636.2
See application file for complete search history.

(56) References Cited

U.S. PATENT DOCUMENTS 5,539,318 A    7/1996  Sasaki
5,650,712 A    7/1997  Kawai et al.

FOREIGN PATENT DOCUMENTS

| JP | 4-115084 A | 10/1992 |
| JP | 6-34727 A | 2/1994 |
| JP | 6-59003 A | 3/1994 |
| JP | 2000-67932 A | 3/2000 |

OTHER PUBLICATIONS

Microfilm of the Specification and Drawings Annexed to the Request of Japanese Utility Model Application, No. 18430/1991, (Laid-open No. 115084/1992), (Kyushu Denki Seizo Kabushiki Kaisha), Oct. 12, 1992.

*Primary Examiner*—Edward H Tso
(74) *Attorney, Agent, or Firm*—Sughrue Mion, PLLC

(57) ABSTRACT

In order to provide a battery charging state arithmetic operation device which can judge a charging state of a battery currently being used easily and in a short time, there are provided battery voltage calculation means 6 with specified load for calculating a first and a second battery voltages when a battery current is at a specified load current value from a first I-V characteristic of the battery which is in a first state as a currently used state and is stored in first I-V characteristic storage means 3 and a second I-V characteristic which is in a second state where the amount of remaining energy is small and is stored in second I-V characteristic storage means 4, and SOC arithmetic operation means 7 for calculating an SOC (charging state) of the battery in the first state by using the first and the second battery voltages calculated.

14 Claims, 11 Drawing Sheets

● : SAMPLING POINT
Vo : BATTERY OPEN-CIRCUIT VOLTAGE
Vc : BATTERY VOLTAGE WITH SPECIFIED LOAD

BATTERY CHARGING STATE ARITHMETIC OPERATION DEVICE FOR CALCULATING CHARGING STATE OF BATTERY, AND BATTERY CHARGING STATE ARITHMETIC OPERATION METHOD

TECHNICAL FIELD

The present invention relates to a battery charging state arithmetic operation device to detect the state of a remaining capacity (that is, charging state) in a state where a battery used for a vehicle or the like is being used, and a battery charging state arithmetic operation method.

BACKGROUND ART

As a conventional estimating method of the remaining capacity of a battery (that is, an estimating method of the charging state of a battery), there is generally known a method in which a battery terminal open-circuit voltage is made as an initial value of the charging state (SOC: State of Charge) of the battery, and a correction is made using an integration value of battery charging/discharging current.

Besides, JP-A-2001-174535 (FIG. 1 and paragraph 0039) discloses "a battery capacity arithmetic operation device in consideration of polarization" in which an accurate I-V (current-voltage) approximate straight line in consideration of polarization of a battery is obtained, so that the charging state with high accuracy can be obtained even in a hybrid car.

In the battery capacity arithmetic operation device in consideration of polarization disclosed in JP-A-2001-174535, it is disclosed that voltage and current of a battery to cause a discharge current to flow through a load of a vehicle is collected to obtain a voltage-current characteristic, the current voltage of the battery is estimated by using the voltage-current characteristic, and the current charging state of the battery is obtained from this estimated voltage, while a battery voltage at a time after the collected current first reaches a large current at the occurrence of maximum polarization of the battery and when the current first reaches a specified current value not larger than the large current after the arrival, is made as an estimated voltage at a maximum polarization influence remaining time in a state where the influence of the maximum polarization remains, and the charging state is corrected by using a difference between the estimated voltage at the maximum polarity influence remaining time and an open-circuit voltage of the battery at the start of driving. However, since the open-circuit voltage of the battery is greatly influenced by the charging, and discharging history up to that time, about one day is required before it becomes stable, and when the charging state during driving is corrected on the basis of the open-circuit voltage immediately before the driving, a judgment error of the charging state can become large.

For example, in such an idling stop vehicle which attracts lots of attention in recent years and has an object to achieve low emission gas and low fuel consumption, since a function to make an engine stop during idling is provided, it is necessary for the battery to store electric power capable of restarting the engine after the engine is stopped, and it is necessary to accurately grasp the charging state (that is, the remaining capacity of the battery) during the use of the battery.

However, since the open-circuit voltage of the battery and the battery capacity are changed due to the influence of amount of battery electrolyte, degradation (softening, corrosion, sulfation, etc.), battery temperature, polarization, and the like, it has been difficult to accurately estimate the battery remaining capacity.

Besides, there are various combinations of a battery size and a performance rank with respect to an automobile rank of an idling stop vehicle determined from an engine displacement and a starter motor or a motor generator and a consumed electric current (hereinafter referred to as an application to be applied) during idling stop of the vehicle.

When this combination is changed, since the remaining capacity of the battery necessary for outputting a battery-minimum output required by the application to be applied is changed, it has been conventionally necessary to review a charging state monitor device corresponding to the application each time the application to be applied is changed.

DISCLOSURE OF THE INVENTION

The invention has been made to solve such problems, and has an object to provide a battery charging state arithmetic operation device in which without being influenced by the change of amount of battery electrolyte, degradation and the like, under electric current conditions of various specified applications, the remaining capacity of a battery currently being used, in other words, the charging state (SOC: State of Charge) of the battery currently being used can be easily grasped (calculated).

The battery charging state arithmetic operation device of the invention includes battery voltage detection means for detecting a voltage of a battery, battery current detection means for detecting a current of the battery, first current-voltage characteristic storage means for approximately obtaining a current-voltage characteristic of the battery in a first state as a currently used state by using voltage values and current values detected by the battery voltage detection means and the battery current detection means at plural sampling points and for storing it as a first current-voltage characteristic, second current-voltage characteristic storage means for previously storing a second current-voltage characteristic in a second state where the amount of extractive energy is smaller than that in the first state, specified current value storage means for storing a specified load current value of the battery, battery voltage calculation means with specified load for calculating a first battery voltage (Vc) when the battery current is at the specified load current value by using the first current-voltage characteristic stored in the first current-voltage characteristic storage means and for calculating a second battery voltage (Vc0) when the battery current is at the specified load current value by using the second current-voltage characteristic, and charging state arithmetic operation means for calculating a charging state of the battery in the first state by using the first and the second battery voltages (Vc, Vc0) calculated by the battery voltage calculation means with specified load a previously prepared conversion map or the like to derive a charging state of the battery from, for example, a voltage difference ΔV (Vc−Vc0) of those voltages.

Besides, the battery charging state arithmetic operation device of the invention is characterized in that a performance level of the battery is detected from the voltage Vc in the first current-voltage characteristic storage means at the time of the specified load current stored in the specified load current storage means and a voltage Vo in the first current-voltage characteristic storage means when a load current is zero and by using performance level detection means such as a previously prepared Vo, Vc—performance level conversion map, and the battery charging state calculated by the battery charging state arithmetic operation means is corrected according to the performance level of the battery.

Besides, the battery charging state arithmetic operation device of the invention is characterized in that the corrected battery charging state as defined in claim 2 is a remaining capacity which the battery can discharge before the battery voltage is lowered from the first battery voltage to the second battery voltage. In order to produce an output as the remaining capacity, a correlation of a voltage difference between the first battery voltage and the second battery voltage with a discharge capacity which can be discharged correspondingly to the battery voltage difference is previously measured under various conditions, and this is held as the conversion map, so that it becomes possible to obtain the remaining capacity which can be discharged.

Besides, the battery charging state arithmetic operation device of the invention is characterized in that a correction gain consistent with a characteristic of the battery is obtained from the performance level of the battery detected by the performance level detection means and by performance level correction gain calculation means such as a previously prepared performance level–correction gain conversion map, the remaining capacity calculated by the battery charging state arithmetic operation device is divided by a maximum battery capacity of the battery corrected by the correction gain, and an arithmetic operation is performed to obtain the battery charging state as an SOC (%). As a method of correcting the maximum battery capacity of the battery, for example, there is a method in which the maximum battery capacity in a new product state is multiplied by the correction gain or is subtracted, so that the maximum battery capacity of the degraded battery is obtained. Here, the maximum battery capacity indicates a discharge electric quantity when, after a battery in a completely charged state, that is, a new battery in a state in which it is charged at 5 hour rate current and a terminal voltage during charging measured every 15 minutes indicates a constant value continuously three times is left at rest for one hour, it is discharged at 5 hour rate current to 1.75 V per cell.

Besides, the battery charging state arithmetic operation device of the invention is characterized in that a current integration value obtained by current integrating means (means for integrating current values with respect to the time while charging is made negative and discharging is made positive, or charging is made positive and discharging is made negative) initialized at a time of execution of the battery charging state arithmetic operation means is added to or subtracted from the remaining capacity recited in claim 4, and the battery charging state is calculated. Here, "initialization is made at the time of execution of the battery charging state arithmetic operation means" means that a parameter of the current integration value is made an initial value (for example, zero) at the time of execution of the arithmetic operation means.

Besides, attention is paid to the point that a range which the charging state SOC can take is 0 to 100% and it is meaningless to take a value exceeding this range, and the battery charging state arithmetic operation device of the invention is characterized in that a current integration value obtained by current integrating means provided with means initialized at the time of execution of the battery charging state arithmetic operation means, such as, for example, a nominal battery capacity of the battery according to battery standards, from the current (charging side is negative, and discharging side is positive) obtained from the battery current detection means is made to pass through a limiter (upper limit) having the battery charging state as an upper limit, and made to pass through a limiter (lower limit) having a lower limit obtained by subtracting the maximum battery capacity from the battery charging state, so that after the current integration value is subtracted from the battery charging state, the battery charging state does not exceed the maximum battery capacity or does not take a negative value.

Besides, the battery charging state arithmetic operation device of the invention includes battery voltage detection means for detecting a voltage of a battery, battery current detection means for detecting a current of the battery, first current-voltage characteristic storage means for approximately obtaining a current-voltage characteristic of the battery in a first state as a currently used state by using voltage values and current values detected by the battery voltage detection means and the battery current detection means at plural sampling points and for storing it as a first current-voltage characteristic, second current-voltage characteristic storage means for previously storing the third current-voltage characteristic in a third state where the amount of extractive energy is larger than that in the first state and the second current-voltage characteristic in a second state where the amount of extractive energy is smaller than that in the first state, specified current value storage means for storing a specified load current value of the battery, battery voltage calculation means with specified load for calculating a first battery voltage when the battery current is at the specified load current value by using the first current-voltage characteristic, for calculating a second battery voltage when the battery current is at the specified load current value by using the second current-voltage characteristic, and for calculating a third battery voltage when the battery current is at the specified load current value by using the third current-voltage characteristic, and charging state arithmetic operation means for calculating a charging state of the battery in the first state by using the first, the second and the third battery voltages calculated by the battery voltage calculation means with specified load.

Besides, the battery charging state arithmetic operation device of the invention is characterized in that the third state is a completely charged state, and the second state is a deep discharge state.

Besides, the battery charging state arithmetic operation device of the invention includes temperature detection means for detecting a temperature of the battery currently being used and is characterized in that the second current-voltage characteristic storage means previously stores, as candidates of the second current-voltage characteristic, current-voltage characteristics at plural specified temperatures from a high temperature to a low temperature in an operating temperature range of battery, and stores, as candidates of the third current-voltage characteristic, current-voltage characteristics at the plural specified temperatures, and selects, as the second current-voltage characteristic and the third current-voltage characteristic, characteristics corresponding to the battery temperature detected by the temperature detection means from the plural stored candidates of the second current-voltage characteristic and the plural candidates of the third current-voltage characteristic.

Besides, the charging state arithmetic operation means of the battery charging state arithmetic operation device of the invention calculates a ratio of a difference between the first battery voltage and the second battery voltage to a difference between the third battery and the second battery voltage.

Besides, the battery charging state arithmetic operation device of the invention is characterized in that the specified load current value is directly inputted from an external device to the battery voltage calculation means with specified load.

Besides, a battery charging state arithmetic operation method of the invention includes a step of detecting voltage values and current values of a battery in a first state as a currently used state at plural sampling points, a step of approximately obtaining a current-voltage characteristic of the battery in the first state by using the detected voltage values and the current values at the plural sampling points and storing it as a first current-voltage characteristic, a step of previously storing the third current-voltage characteristic in a third state where the amount of energy extracted is larger than that in the first state and the second current-voltage characteristic in a second state where the amount of energy extracted is smaller than that in the first state, a step of storing a specified load current value of the battery, a step of calculating a first battery voltage when the battery current is at the specified load current value by using the first current-voltage characteristic, calculating a second battery voltage when the battery current is at the specified load current value by using the second current-voltage characteristic, and calculating a third battery voltage when the battery current is at the specified load current value by using the third current-voltage characteristic, and a step of calculating a charging state of the battery in the first state by using the first, the second and the third battery voltages calculated.

Besides, the battery charging state arithmetic operation method of the invention is characterized in that the third state is a completely charged state, and the second state is a deep discharge state.

Besides, at the step of calculating the battery charging state in the battery charging state arithmetic operation method of the invention, a ratio of a difference between the first battery voltage and the second battery voltage to a difference between the third battery and the second battery voltage is calculated.

The battery charging state arithmetic operation device of the invention includes the battery voltage detection means for detecting the voltage of the battery, the battery current detection means for detecting the current of the battery, the first current-voltage characteristic storage means for approximately obtaining the current-voltage characteristic of the battery in the first state as the currently used state by using the voltage values and the current values detected by the battery voltage detection means and the battery current detection means at the plural sampling points and for storing it as the first current-voltage characteristic, the second current-voltage characteristic storage means for previously storing the second current-voltage characteristic in the second state where the amount of extractive energy is smaller than that in the first state, the specified current value storage means for storing the specified load current value of the battery, the battery voltage calculation means with specified load for calculating the first battery voltage when the battery current is at the specified load current value by using the first current-voltage characteristic stored in the first current-voltage characteristic storage means and for calculating the second battery voltage when the battery current is at the specified load current value by using the second current-voltage characteristic, and the charging state arithmetic operation means for calculating the charging state of the battery in the first state by using the first and the second battery voltages calculated by the battery voltage calculation means with specified load. Accordingly, without being influenced by the change in amount of battery electrolyte, degradation, battery temperature and the like, under an electric current condition of a specified application, the charging state (SOC) of the battery currently being used can be judged easily and in a short time, and it is possible to provide a desirable battery charging state arithmetic operation device which can be applied to various uses such as a hybrid car and an electric vehicle which requires monitoring of a charging state at all times, and an idle stop vehicle also.

BEST MODE FOR CARRYING OUT THE INVENTION

Hereinafter, an embodiment of the invention will be described with reference to the drawings. Incidentally, in the respective drawings, the same characters denote the same or like parts Embodiment 1

Figure 1:
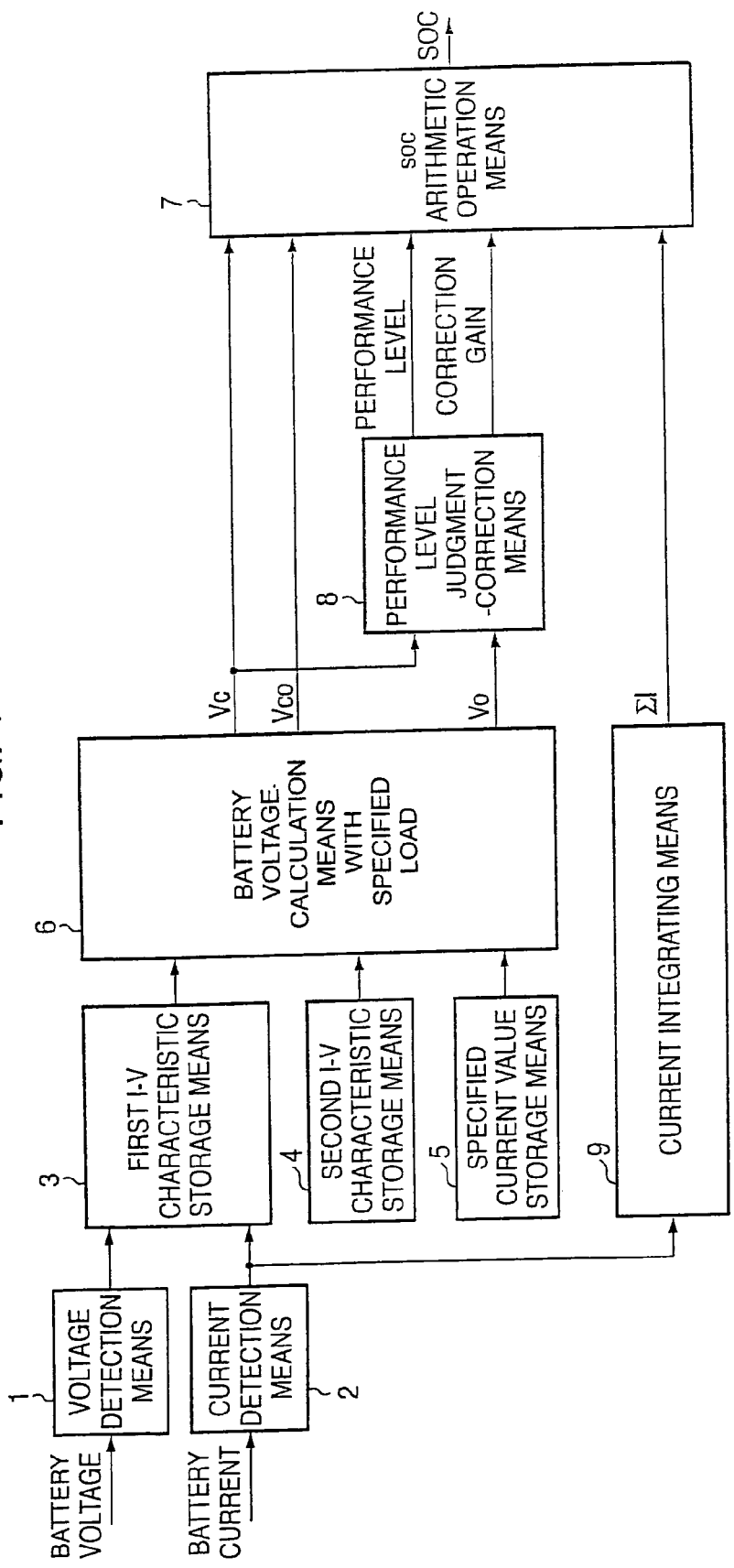
FIG. 1 is a block diagram showing a structure of a battery charging state detection device according to embodiment 1.
Figure 2:
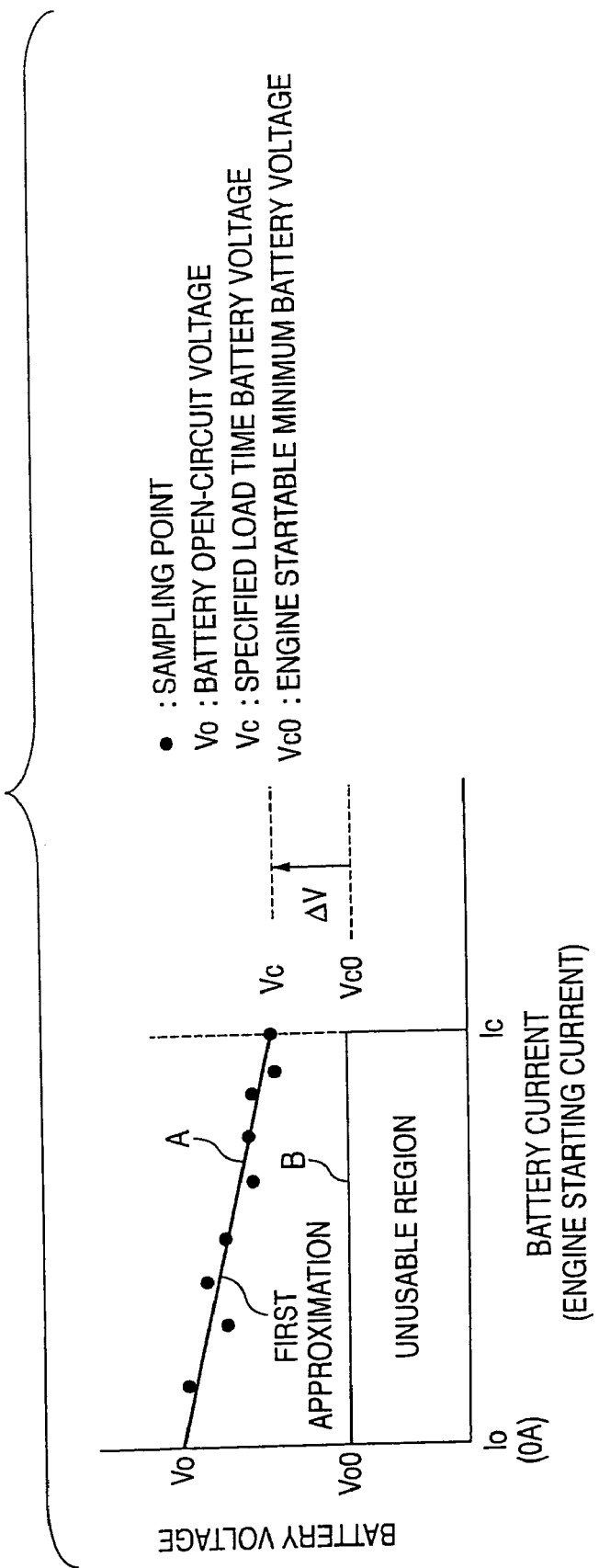
FIG. 2 is a diagram for explaining an operation of the battery charging state detection device according to embodiment 1.

FIG. 1 is a block diagram showing a structure of a battery charging state arithmetic operation device according to embodiment 1. FIG. 2 is a diagram for explaining an operation of the battery charging state arithmetic operation device according to this embodiment.

The structure and the operation of the battery charging state arithmetic operation device according to this embodiment will be described with reference to FIGS. 1 and 2.

In FIG. 1, reference numeral 1 denotes voltage detection means for detecting a battery voltage of a battery (not shown) mounted in a hybrid car, an electric vehicle, an idle stop vehicle or the like; 2, current detection means for detecting a charging and discharging current of the battery; and 3, first current (I)-voltage (V) characteristic storage means of the battery. Hereinafter, the "current-voltage characteristic" will be referred to as the "I-V characteristic".

The first I-V characteristic storage means 3 stores battery voltages V and battery currents I detected by the voltage detection means 1 and the current detection means 2 at plural sampling points (respective points indicated by • marks in FIG. 2) when the battery current (load current) of a battery as a calculation object of a charging state and currently being used (hereinafter simply referred to as a battery or a relevant battery) is changed from a current with a specified load (for example, with a maximum load in an application such as engine starting) to a current with a battery load opening.

Here, the state of the battery currently being used will be referred to as a first state.

The first I-V characteristic storage means 3 performs an arithmetic operation to obtain and store a first I-V characteristic (that is, I-V characteristic in the currently used first state) of the relevant battery expressed by "$V=-\beta I+\alpha$" by, for example, first approximation using the least squares method from the stored values of the battery voltage V and the battery current I at the plural sampling points. Here, $\alpha$ and $\beta$ are positive constants. Incidentally, a straight line indicated by character A in FIG. 2 denotes the first I-V characteristic.

Reference numeral 4 denotes second I-V characteristic storage means, and a theoretical second I-V characteristic expressed by "$V=-\beta' I+\alpha'$" in a second state where the amount of extractive energy from the battery is small is previously stored in this second I-V characteristic storage means 4. Here, $\alpha'$ and $\beta'$ are also positive constants. Incidentally, a straight line indicated by character B in FIG. 2 indicates the second I-V characteristic.

The foregoing second state of the battery is a state in which the amount of extractive energy from the battery is small as in, for example, a case of a deep discharge state in which the battery is degraded, its remaining capacity becomes small, and it is discharged to become nearly unusable, or a state close to this.

Incidentally, the theoretical second I-V characteristic in the deep discharge state is the minimum line I-V characteristic in which the battery is in a degraded state and a battery voltage not lower than a required specified voltage can be ensured even in the case where a discharge current not smaller than a specified load current (for example, an electric current necessary for engine starting) is made to flow. Here, the I-V characteristic of the minimum line used as the boundary to the unusable region]depicted in FIG. 2 has also the meaning of the minimum voltage at which the engine can be started or the operation limit of a control unit (including an audio and the like) mounted in an automobile. That is, the battery charging state here means that in addition to the performance as the battery, the minimum at which the whole system including electric loads to be connected is established is made SOC=0, and the line indicating that is denoted by character B in FIG. 2.

Reference numeral 5 denotes specified current value storage means in each application (for example, starting of an engine, etc.), and for example, a current value necessary for engine starting is stored in the specified current value storage means 5.

Reference numeral 6 denotes battery voltage calculation means with specified load, and the battery voltage calculation means 6 with specified load uses the first I-V characteristic stored in the first I-V characteristic storage means 3 (that is, the I-V characteristic of the battery in the currently used state) and the specified current value stored in the specified current value storage means 5 (for example, an engine starting current Ic), and calculates a battery voltage Vc (see FIG. 2) when the battery current is at the specified current value (engine starting current Ic). Incidentally, the battery voltage when the battery has the specified load (specified current value) obtained from the first I-V characteristic will be referred to as a first battery voltage. Accordingly, the above calculated battery voltage Vc is the first battery voltage.

Besides, the battery voltage calculation means 6 with specified load uses the second I-V characteristic stored in the second I-V characteristic storage means 4 and the specified current value stored in the specified current value storage means 5, and calculates a battery voltage Vc0 (see FIG. 2) when the battery current is at the specified current value. Incidentally, the battery voltage when the battery has the specified load (specified current value) obtained from the second I-V characteristic will be referred to as a second battery voltage. Accordingly, the above calculated battery voltage Vc0 is the second battery voltage.

Besides, in FIG. 2, Vo and Vo0 respectively denote battery voltages when the battery current is zero (load opening) in the first and the second I-V characteristics.

In the case where the application of the battery is engine starting, when the battery is degraded to such a degree that the battery voltage becomes Vc0 or lower when the battery current is the engine starting current Ic, this battery is unusable.

Reference numeral 7 denotes SOC (charging state) arithmetic operation means, and the SOC (charging state) arithmetic operation means 7 uses the battery voltage Vc calculated by the battery voltage calculation means 6 with specified load and the battery voltage Vc0 to obtain the remaining capacity (Ah) of the battery, and calculates the SOC (charging state) from a result obtained in such a manner that a result obtained by adding or subtracting a current integration value $\Sigma I$ obtained by current integrating means 9 for integrating current values of the current detection means 2 to or from the obtained battery remaining capacity is divided by a maximum battery capacity of a degraded battery estimated by multiplying a maximum battery capacity of a new battery by a correction gain obtained by performance level judgment-correction means 8.

It can be judged that as an index expressing this calculation result becomes large, the maximum battery capacity of the degraded battery is large and the energy sufficiently remains, and as this index becomes small, the maximum battery capacity is small and the state is close to an unusable state.

Incidentally, since the second I-V characteristic is previously stored in the second I-V characteristic storage means 4, the second battery voltage can be easily calculated in a short time.

As described above, the battery charging state arithmetic operation device of this embodiment includes the first I-V characteristic storage means 3 for approximately obtaining and storing the I-V characteristic (first I-V characteristic) of the battery in the first state as the currently used state, the second I-V characteristic storage means 4 for previously storing the I-V characteristic (second I-V characteristic) of the battery in the second state where the amount of extractive energy is smaller than that in the first state, the battery voltage calculation means 6 with specified load for calculating the first battery voltage when the battery current is at the specified load current value by using the first I-V characteristic and the second battery voltage when the battery current is at the specified load current value by using the second I-V characteristic, and the charging state arithmetic operation means 7 for calculating the charging state of the battery in the first state by using the first and the second battery voltages calculated. Accordingly, without being influenced by the change in amount of battery electrolyte, degradation, battery temperature and the like, under an electric current condition of a specified application, the charging state (SOC) of the battery currently being used can be grasped (judged) easily and in a short time, and it is possible to provide the battery charging state arithmetic operation device which is appropriate to a battery used for a hybrid car an electric vehicle, which requires monitoring of a charging state (remaining capacity) at all times, and an idle stop vehicle also.

Embodiment 2

Figure 3:
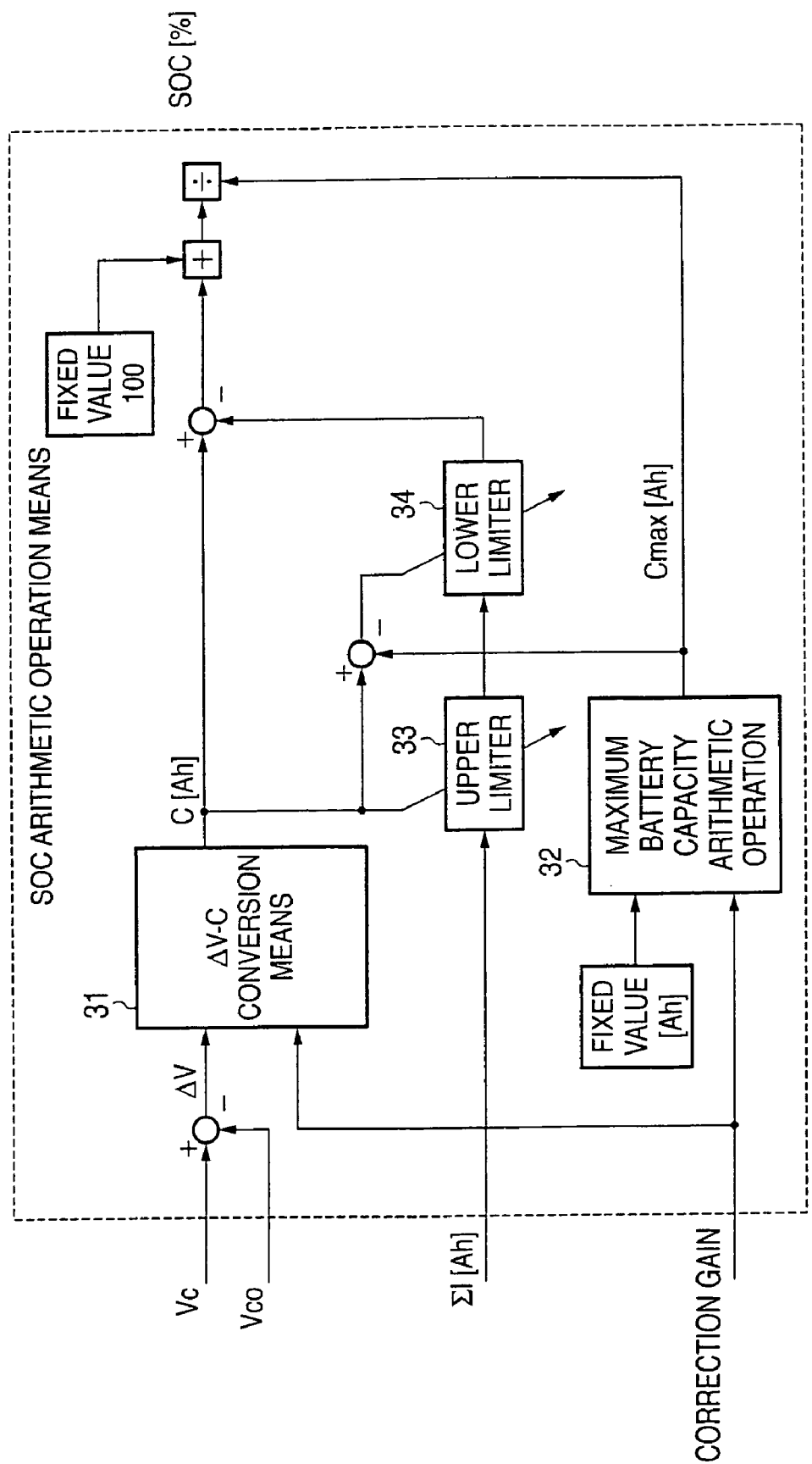
FIG. 3 is a block diagram showing a structure of SOC arithmetic operation means according to embodiment 2.

FIG. 3 is a block diagram showing a structure of the SOC arithmetic operation means 7 shown in FIG. 1 and according to embodiment 2.

Figure 4:
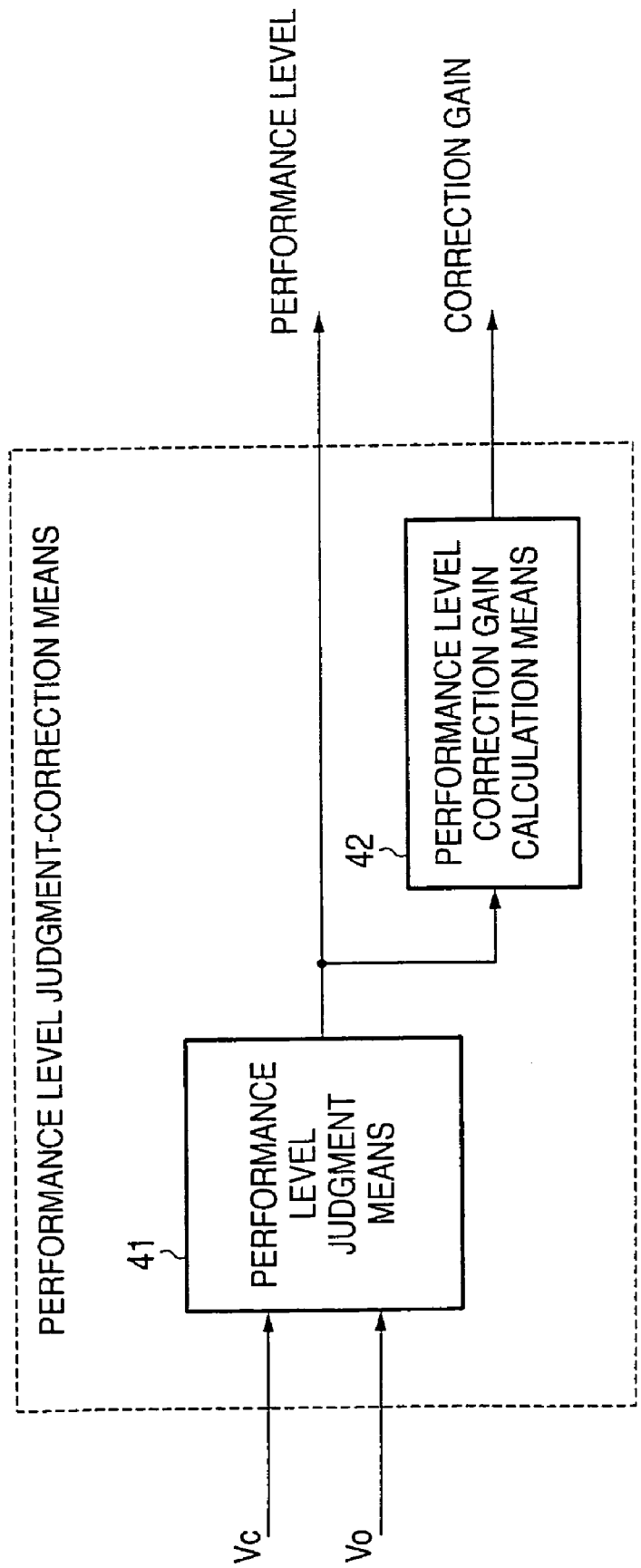
FIG. 4 is a block diagram showing a structure of performance level judgment/correction means according to embodiment 3.

In FIG. 3, reference numeral 31 denotes ΔV–C conversion means for obtaining a battery charging state C from a voltage difference (Vc–Vc0) ΔV between the first battery voltage Vc already explained in FIG. 1 and the second battery voltage Vc0 similarly already explained in FIG. 1; 32, maximum battery capacity arithmetic operation means for obtaining a maximum battery capacity Cmax which is obtained by multiplying a nominal battery capacity of the battery by a correction gain explained in FIG. 4; 33, an upper limiter for limiting a current integration value ΣI by the previously obtained battery charging state C; and 34, a lower limiter for limiting the previously limited ΣI by what is obtained by subtracting the previously obtained maximum battery capacity Cmax from the previously obtained battery charging state C.

Figure 5:
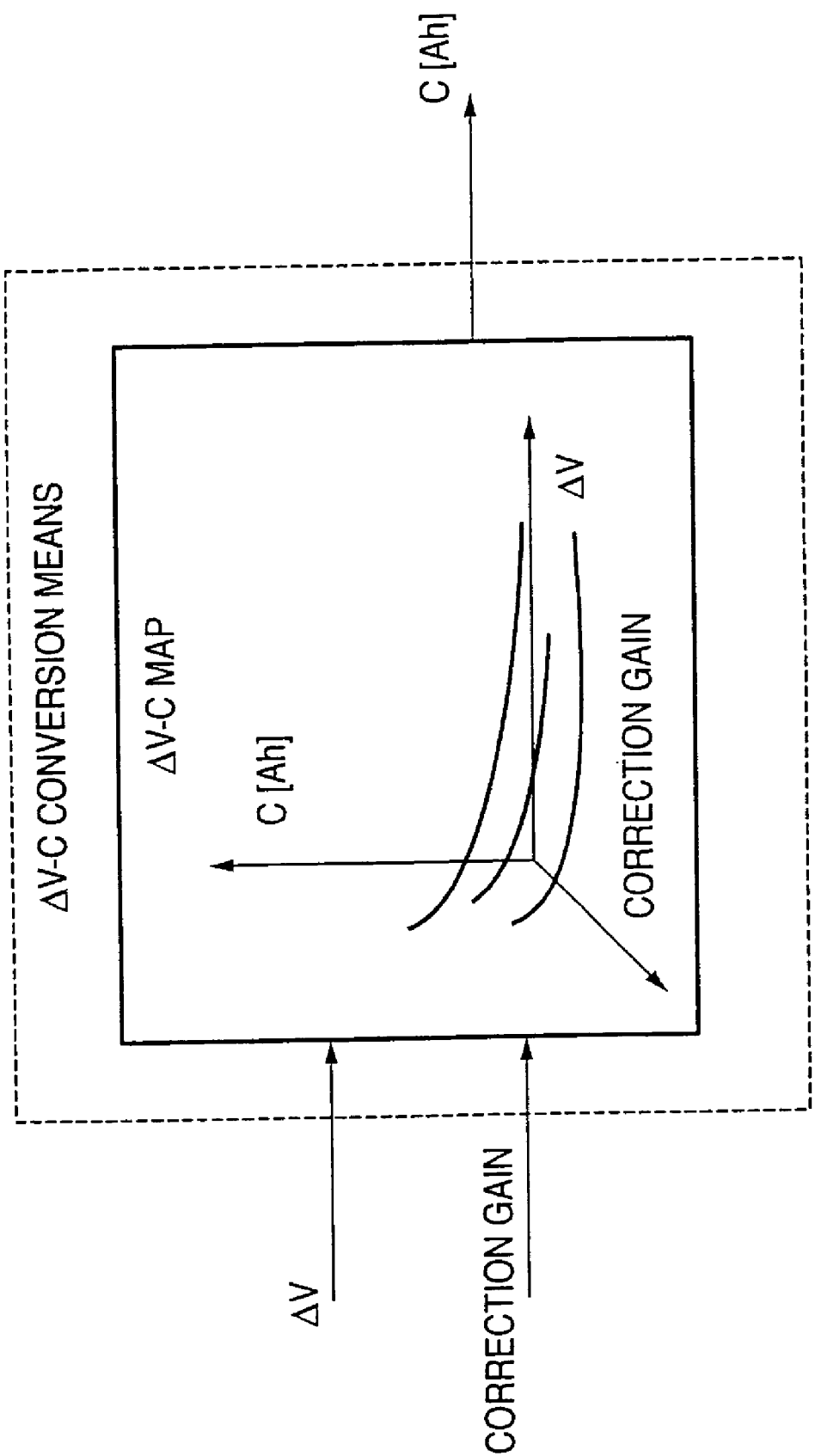
FIG. 5 is a block diagram showing a structure of $\Delta V-C$ conversion means according to embodiment 2.

Next, this embodiment will be described. The voltage difference ΔV between the first battery voltage Vc and the second battery voltage Vc0 is obtained, and the charging state C of the battery is detected by the ΔV–C conversion means 31. As the method, it may be previously obtained from characteristics of the battery by preparing, for example, a one-dimensional map in which the voltage difference ΔV (V) is the X axis and the battery capacity (Ah) C is the Y axis, or a two-dimensional map (see FIG. 5) in which the voltage difference ΔV (V) is the X axis, the correction gain is the Y axis, and the battery charging state (Ah) C is the Z axis.

Next, the maximum battery capacity (Ah) of the battery currently being used is obtained from the nominal battery capacity (Ah) of the battery and the correction gain by using the maximum battery capacity arithmetic operation means 32. In the case of a new battery, the actual battery capacity is generally larger than the nominal battery capacity. However, the maximum battery capacity is changed by the usage of the battery including the environment where the battery has been placed and other factors. In general, although there is a tendency that the maximum battery capacity becomes small according to the use time, it is not uniform according to the usage. In order to correct this, the nominal battery capacity is corrected by the correction gain obtained from the performance level explained in FIG. 4.

Next, the current integration value ΣI is limited by such a value that the battery charging state (Ah) obtained by the ΔV–C conversion means 31 is made the upper limit and by using the upper limiter 33. The current value I indicates a positive value at the time of discharging and a negative value at the time of charging. This is because in the case where discharging continues and the current integration value ΣI becomes larger than the value of the battery charging state C, a subsequently obtained SOC value becomes negative, and this should be suppressed. Similarly, the current integration value ΣI' having passed through the upper limiter 33 is limited by a value as a lower limit which is obtained by subtracting the maximum battery capacity Cmax obtained by the maximum battery capacity arithmetic operation means 32 from the battery charging state (Ah) obtained by the ΔV–C conversion means 31 and by using the lower limiter 34. This is because when charging continues, the value obtained by subtracting the current integration value ΣI from the value of the battery charging state C exceeds 100% in a subsequent SOC arithmetic operation portion, and this should be suppressed.

Embodiment 3

FIG. 4 is a block diagram showing a structure of the performance level judgment-correction means 8 shown in FIG. 1 and according to embodiment 3.

Reference numeral 41 denotes performance level judgment means for obtaining a performance level from the first battery voltage Vc and the battery voltage Vo when the battery current is zero (load opening time) in the first I-V characteristic;

and 42, performance level correction gain calculation means for obtaining a correction gain from the performance level obtained by the performance level judgment means 41.

Figure 6:
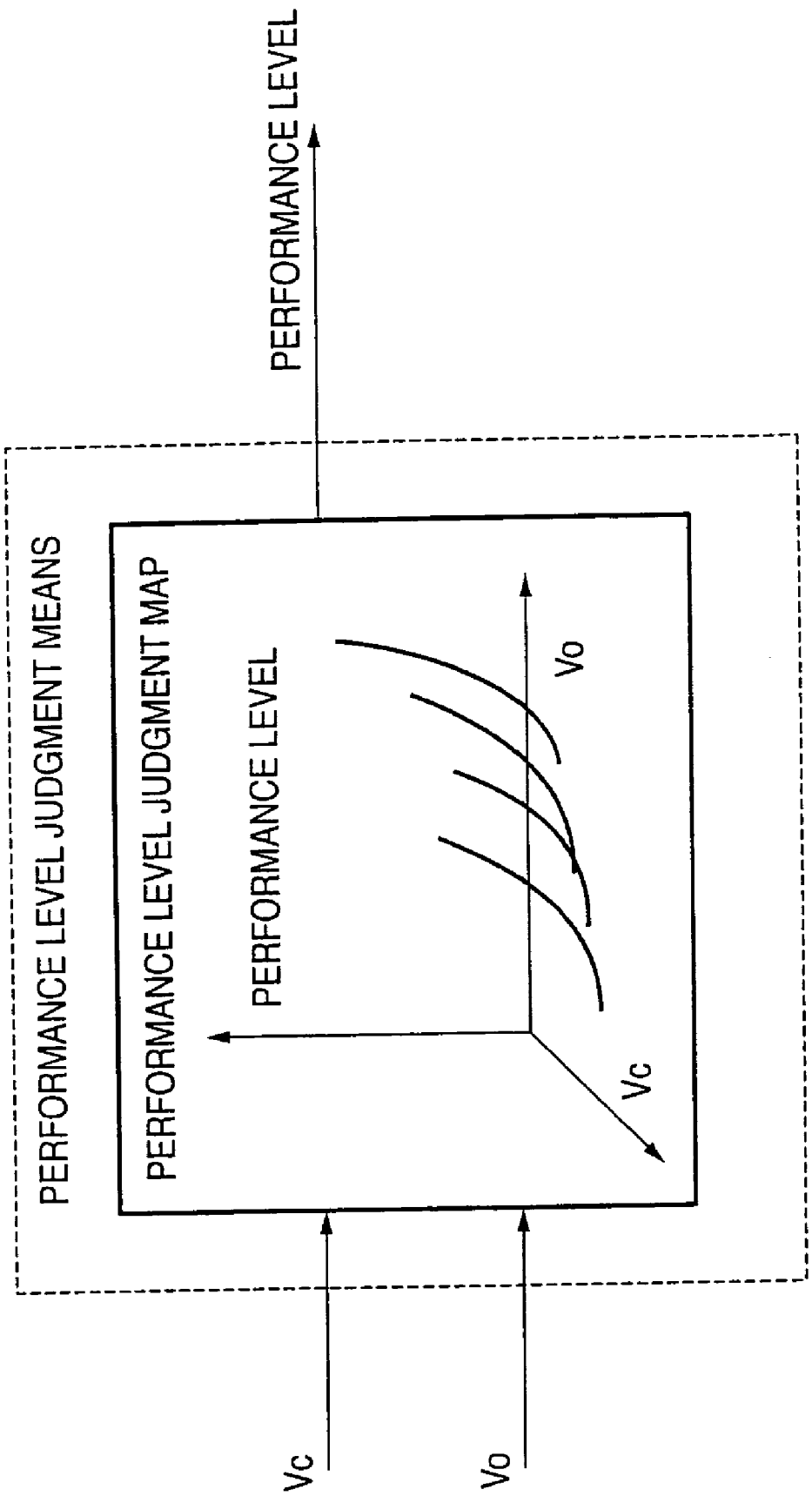
FIG. 6 is a block diagram showing a structure of performance level judgment means according to embodiment 3.
Figure 7:
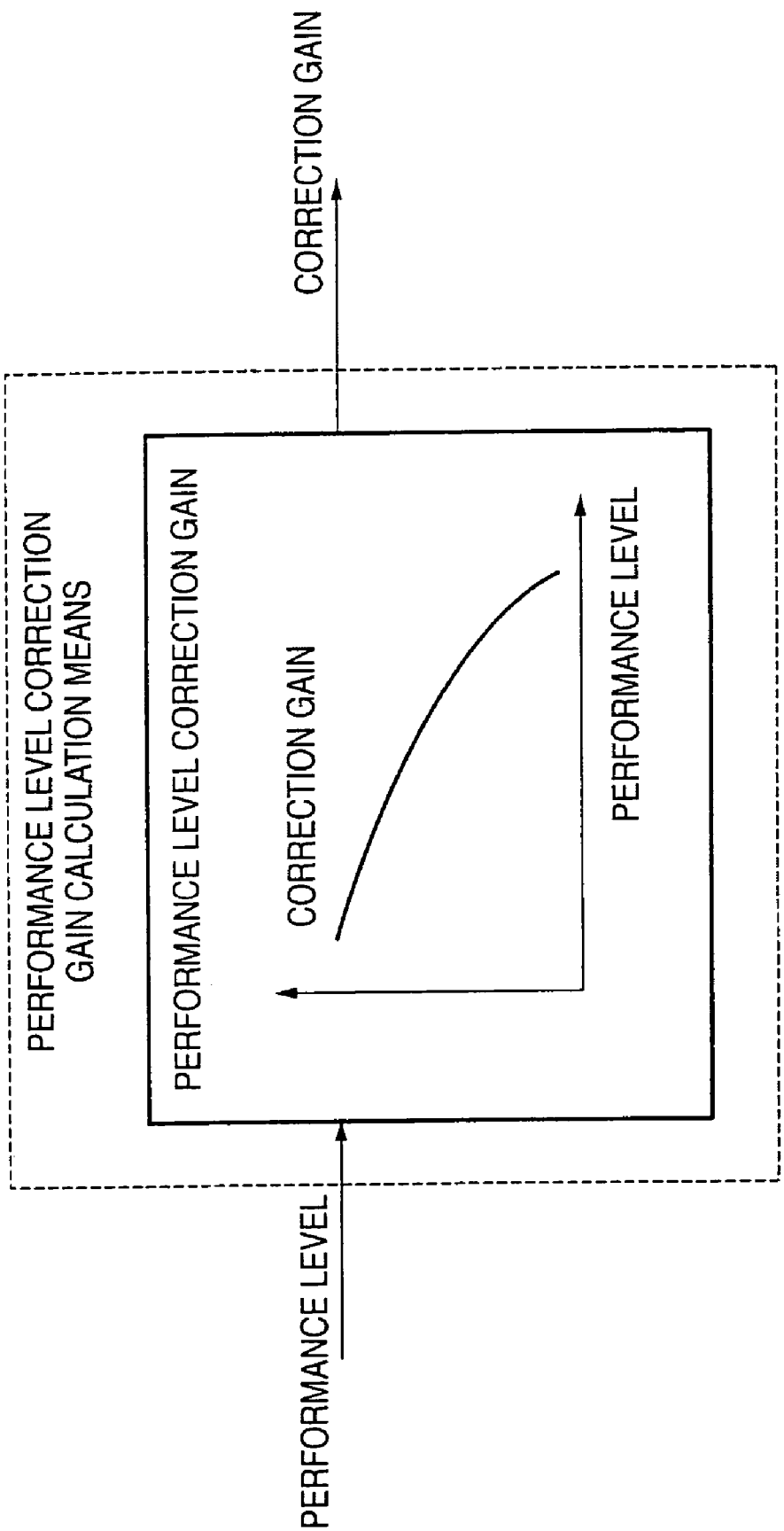
FIG. 7 is a block diagram showing a structure of performance level correction gain calculation means according to embodiment 3.

Next, this embodiment will be described. The performance level of the battery currently being used is detected from the first battery voltage Vc and the battery voltage Vo when the battery current is zero (load opening time) in the first I-V characteristic and by using the performance level detection means 8. In the case where the open circuit voltage is plotted on the horizontal axis while the first battery voltage Vc is plotted on the vertical axis, the battery has a tendency that as the degree of degradation advances, the plot value changes toward the right direction. For example, by using this, a two-dimensional map (see FIG. 6) is previously prepared in which the battery voltage Vo when the battery current is zero (load opening time) in the first I-V characteristic is the X axis, the first battery voltage Vc is the Y axis, and the performance level is the Z axis, and the performance level is detected. Besides, the influence of the performance level also gives an influence on the ΔV-C conversion and the maximum battery capacity Cmax. Since the performance level is not in a proportional relation, it is hard to directly use for correction of the ΔV-C conversion. Thus, the correction gain is obtained by using, for example, a map (see FIG. 7) in which the performance level is the X axis and the correction gain is the Y axis, and by using the performance level correction gain calculation means 42, and is used for subsequent correction so that linear interpolation is possible.

Embodiment 4

Figure 8:
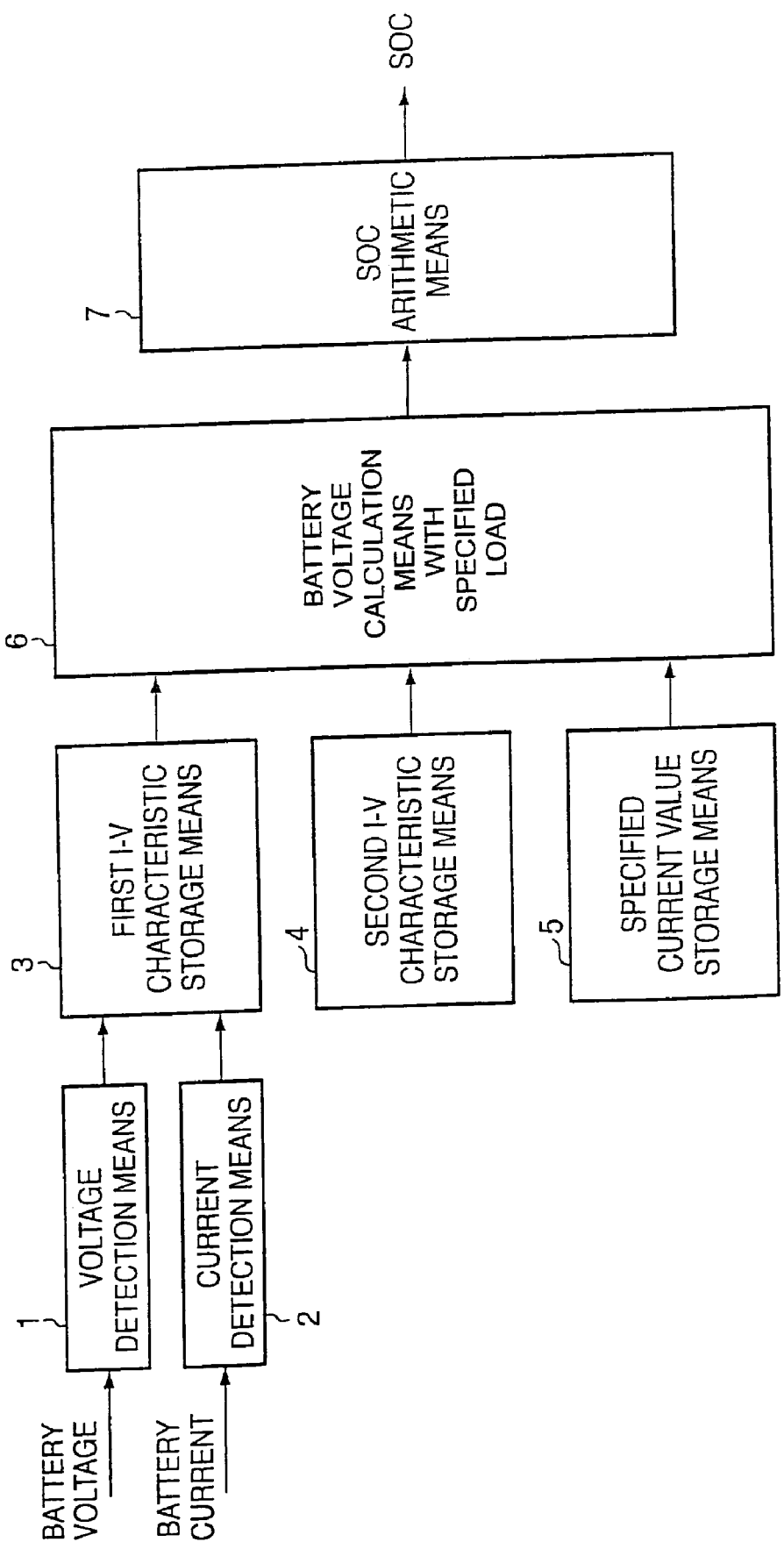
FIG. 8 is a block diagram showing a structure of a battery charging state detection device according to embodiment 4.
Figure 9:
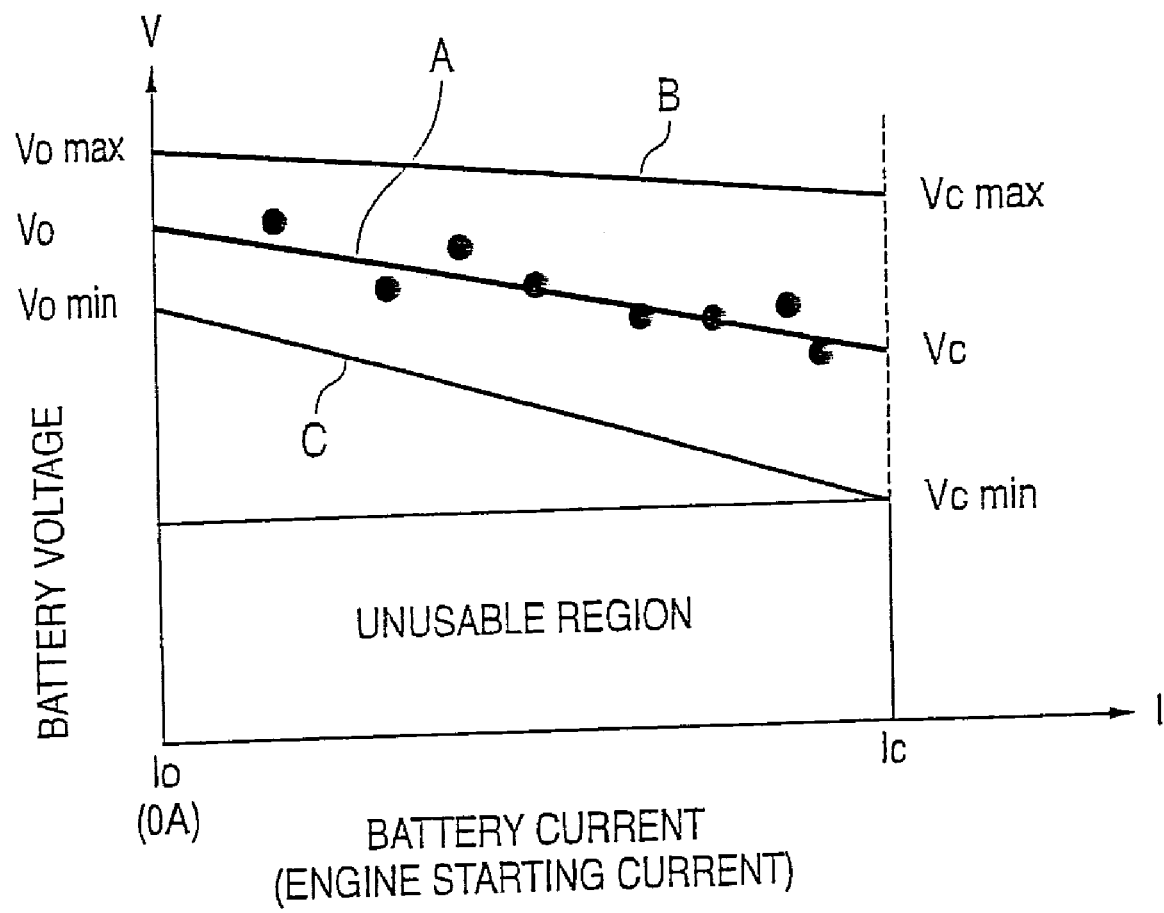
FIG. 9 is a diagram for explaining an operation of a battery charging state detection device according to embodiment 4.

FIG. 8 is a block diagram showing a structure of a battery charging state arithmetic operation device according to embodiment 4. FIG. 9 is a diagram for explaining an operation of the battery charging state arithmetic operation device according to this embodiment.

The structure and the operation of the battery charging state arithmetic operation device according to this embodiment will be described with reference to FIG. 8 and FIG. 9.

In FIG. 8, reference numeral 1 denotes voltage detection means for detecting a battery voltage of a battery (not shown) mounted in a hybrid car, an electric vehicle or the like; 2, current detection means for detecting a charging/discharging current of the battery; and 3, first current (I)-voltage (V) characteristic storage means of the battery.

The first I-V characteristic storage means 3 stores battery voltages V and battery currents I detected by the voltage detection means 1 and the current detection means 2 at plural sampling points (respective points indicated by • marks in FIG. 9) when the battery current (load current) of the battery currently being used to be arithmetically operated in the charging state (hereinafter simply referred to as the battery or the relevant battery) is changed from a current at a time of a specified load (for example, at a time of maximum load in an application such as engine starting) to a current when a battery load is opened. Here, a state of the battery currently being used will be referred to as a first state.

The first I-V characteristic storage means 3 performs an arithmetic operation to obtain and store a first I-V characteristic (that is, I-V characteristic in the currently used first state) of the relevant battery expressed by "$V=-\beta I+\alpha$" from the stored values of the battery voltage V and the battery current I at the plural sampling points and by, for example, first approximation using the least squares method. Here, $\alpha$ and $\beta$ are positive constants.

Incidentally, a straight line indicated by character A in FIG. 9 indicates this first I-V characteristic.

Reference numeral 4 denotes second I-V characteristic storage means, and a theoretical third I-V characteristic expressed by "$V=-\beta' I+\alpha'$" in a third state as a state where the amount of extractive energy from the battery is large, and a theoretical second I-V characteristic expressed by "$V=-\beta'' I+\alpha''$" in a second state as a state where the amount of extractive energy from the battery is small are previously stored in this second I-V characteristic storage means 4. Here, $\alpha'$, $\alpha''$, $\beta'$ and $\beta''$ are also positive constants.

Straight lines indicated by character B and character C in FIG. 9 respectively indicate the third I-V characteristic and the second I-V characteristic.

The foregoing third state of the battery is a state in which the amount of extractive energy from the battery is large, for example, a completely charged state as regulated by JIS D 5301, that is, a state in which charging is made at 5 hour rate current, and a terminal voltage during charging measured every 15 minutes indicates a constant value continuously three times, or a state close to this.

Besides, the second state of the battery is a state in which the amount of extractive energy from the battery is small, like a case of deep discharge state where the battery is degraded, its remaining capacity becomes small, and it is discharged nearly to become unusable, or a state close to this. Incidentally, the theoretical second I-V characteristic in the deep discharge state is the I-V characteristic of a minimum line in which the battery is in a degraded state, and a battery voltage not lower than a necessary specified voltage can be ensured even in the case where a discharge current not smaller than a specified load current (for example, a current necessary for engine starting) is made to flow.

Reference numeral 5 denotes specified current value storage means in each application (for example, starting of an engine, etc.), and for example, a current value necessary for engine starting is stored in the specified current value storage means 5.

Reference numeral 6 denotes battery voltage calculation means with specified load, and the battery voltage calculation means 6 with specified load uses the I-V characteristic stored in the first I-V characteristic storage means 3 (that is, the I-V characteristic of the battery currently being used), and the specified current value (for example, engine starting current Ic) stored in the specified current value storage means 5, and calculates a battery voltage Vc (see FIG. 9) when the battery current is the specified current value (engine starting current Ic). Incidentally, the battery voltage when the battery has the specified load (specified current value) obtained from the first I-V characteristic will be referred to as a first battery voltage. Accordingly, the above calculated battery voltage Vc is the first battery voltage.

Besides, the battery voltage calculation means 6 with specified load uses the third I-V characteristic stored in the second I-V characteristic storage means 3 and the specified current value stored in the specified current storage means 5, and calculates a battery voltage Vc max (see FIG. 9) when the battery current is at the specified current value. Incidentally, the battery voltage when the battery has the specified load (specified current value) obtained from the third I-V characteristic will be referred to as a third battery voltage. Accordingly, the above calculated battery voltage Vc max is the third battery voltage.

Similarly, the battery voltage calculation means 6 with specified load uses the second I-V characteristic stored in the second I-V characteristic storage means 3 and the specified current value stored in the specified current value storage means 5, and calculates a battery voltage Vc min (see FIG. 9) when the battery current is at the specified current value. Incidentally, the battery voltage when the battery has the specified load (specified current value) obtained from the second I-V characteristic will be referred to as a second battery voltage. Accordingly, the above calculated battery voltage Vc min is the second battery voltage.

Besides, in FIG. 9, Vo, Vo max and Vo min denote battery voltages when the battery current is zero (load opening) in the first, the third and the second I-V characteristics, respectively.

In the case where the application of the battery is engine starting, when the battery is degraded to such a degree that the battery voltage becomes Vc min or lower when the battery current is the engine starting current Ic, this battery is unusable.

Reference numeral 7 denotes SOC (charging state) arithmetic operation means, and the SOC (charging state) arithmetic operation means 7 uses the battery voltage Vc calculated by the battery voltage calculation means 6 with specified load, the battery voltage Vc max and the battery voltage Vc min, and calculates the SOC (charging state) of the battery on the basis of an expression shown below.

$$SOC=[(Vc-Vcmin)/(Vcmax-Vcmin)]\times 100\ (\%)$$

That is, the SOC arithmetic operation device 7 calculates the ratio of a difference between the first battery voltage (Vc) and the second battery voltage (for example, Vc min) to a difference between the third battery voltage (for example, Vc max) and the second battery voltage (for example, Vc min). The numerical value (%) of this calculation result becomes an index to express the charging state of the battery.

Accordingly, it can be judged that as the index expressing this calculation result becomes large, the remaining capacity of the battery is large, and the energy sufficiently remains, while as the index becomes small, the remaining capacity is small and the state is close to a degraded state. Incidentally, since the second I-V characteristic and the third I-V characteristic are previously stored in the second I-V characteristic storage means, the second battery voltage and the third battery voltage can be easily calculated in a short time.

Besides, since the SOC (charging state) arithmetic operation means merely calculates the ratio of the difference between the first battery voltage and the second battery voltage to the difference between the third battery and the second battery voltage, the calculation result can be obtained by the arithmetic operation processing in a short time.

As described above, the battery charging state arithmetic operation device of this embodiment includes the first I-V characteristic storage means for approximately obtaining and storing the I-V characteristic (first I-V characteristic) of the battery in the first state as the currently used state, the second I-V characteristic storage means for previously storing the I-V characteristic (third I-V characteristic) of the battery in the third state where the amount of extractive energy is larger than that in the first state and the I-V characteristic (second I-V characteristic) of the battery in the second state where the amount of extractive energy is smaller than that in the first state, the battery voltage calculation means with specified load for calculating the first battery voltage when the battery current is at the specified load current value by using the first I-V characteristic, the second battery voltage when the battery current is at the specified load current value by using the second I-V characteristic, and the third battery voltage when the battery current is at the specified load current value by using the third I-V characteristic, and the charging state arithmetic operation means for calculating the charging state of the battery in the first state by using the first, the second and the third battery voltages calculated. Accordingly, without being influenced by the change in amount of battery electrolyte, degradation, battery temperature and the like, under an electric current condition of a specified application, the charging state (SOC) of the battery currently being used can be grasped (judged) easily and in a short time, and it is possible to provide the battery charging state arithmetic operation device appropriate to a battery used for a hybrid car which requires monitoring of a charging state (remaining capacity) at all times.

Embodiment 5

Figure 10:
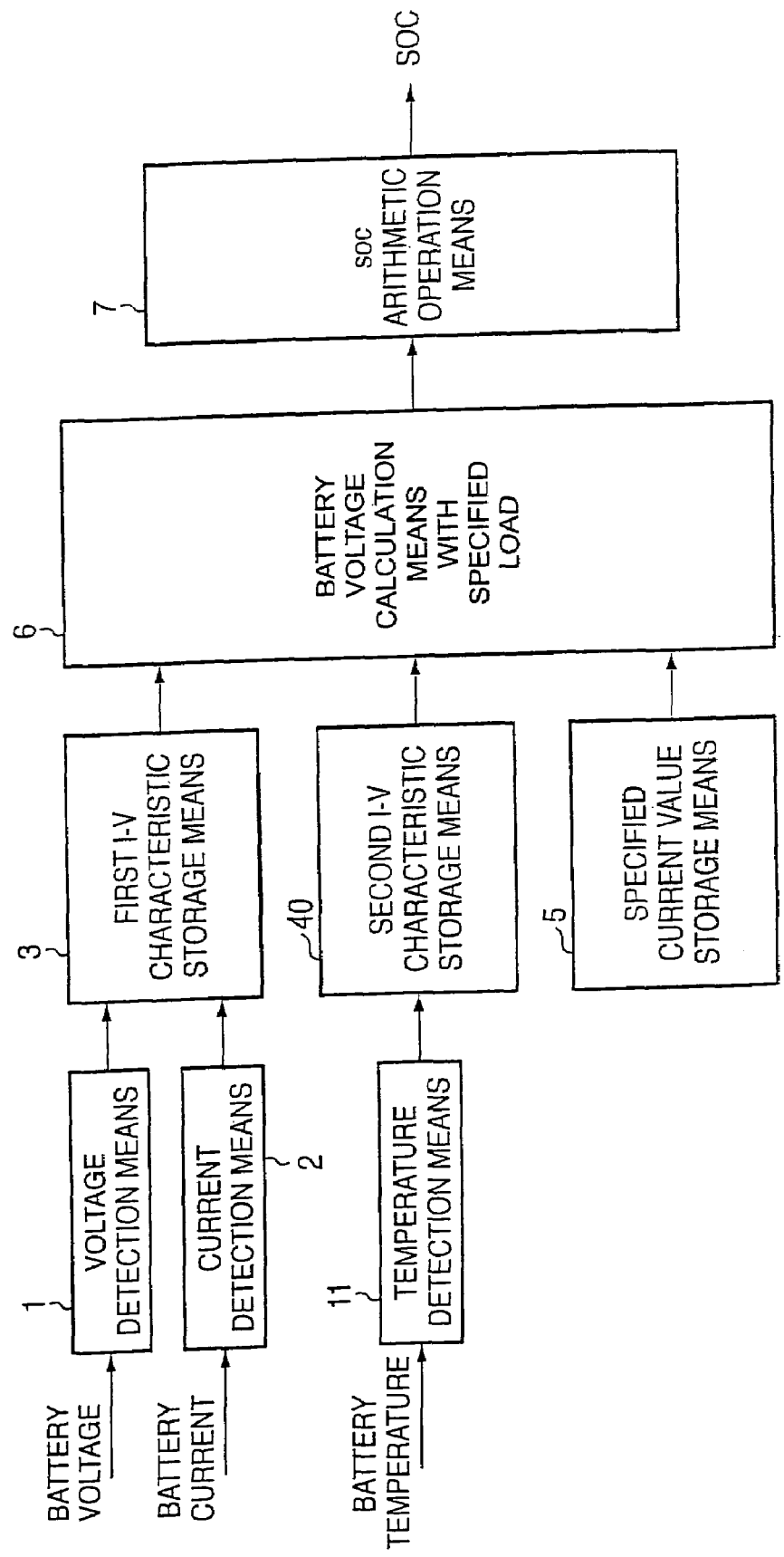
FIG. 10 is a block diagram showing a structure of a battery charging state detection device according to embodiment 5.

FIG. 10 is a block diagram showing a structure of a battery charging state arithmetic operation device according to embodiment 5.

In the drawing, reference numeral 1 denotes voltage detection means for detecting a battery voltage; 2, current detection means for detecting a battery current; 3, first I-V (current-voltage) characteristic storage means; 40, second I-V (current-voltage) characteristic storage means; 5, specified current value storage means; 6, battery voltage calculation means with specified load; 7, SOC (charging state) arithmetic operation means; and 11, temperature detection means for detecting a battery temperature.

In the second I-V characteristic storage means 4 of the battery charging state arithmetic operation device according to the foregoing embodiment 1, the third I-V characteristic of the battery in the third state where the amount of extractive energy is large, and the second I-V characteristic of the battery in the second state where the amount of extractive energy is small are previously stored. The second and the third I-V characteristics are those at a specified temperature irrelevant to the temperature of the battery currently being used.

Since the impedance of a battery is increased when its temperature becomes low, the amount of extractive energy becomes small. On the other hand, since the impedance is lowered when the temperature becomes high, the amount of extractive energy becomes large. Thus, the second I-V characteristic storage means 40 of the battery charging state arithmetic operation device according to this embodiment previously stores, as candidates of the third I-V characteristic of the battery in the third state where the amount of extractive energy is large, plural I-V characteristics at plural specified temperatures from a high temperature to a low temperature in an operating temperature range of battery.

Similarly, the second I-V characteristic storage means 40 previously stores, as candidates of the second I-V characteristic of the battery in the second state where the amount of extractive energy is small, plural I-V characteristics at the plural specified temperatures from the high temperature to the low temperature in an operating temperature range of battery.

Similarly to the case of the foregoing embodiment 1, the first I-V characteristic storage means 3 uses voltage values and current values of the battery detected by the voltage detection means 1 and the current detection means 2 at plural sampling points, and approximately obtains the first I-V characteristic of the battery in the first state as the currently used state, and stores it as the first I-V characteristic. Accordingly, the first current-voltage characteristic stored in the first I-V characteristic storage means 3 is the I-V characteristic at the temperature of the battery currently being used.

The temperature detection means 11 detects the temperature of the battery currently being used, and inputs the detected temperature data to the second I-V characteristic storage means 40.

The second I-V characteristic storage means 40 selects the I-V characteristic corresponding to the temperature of the battery currently being used (that is, at the temperature closest to the temperature of the battery currently being used) from the plural I-V characteristics previously stored as the candidates of the third I-V characteristic on the basis of the temperature data detected by the temperature detection means 11, and outputs this as the third I-V characteristic to the battery voltage calculation means 6 with specified load.

Besides, the second I-V characteristic storage means 40 selects the I-V characteristic corresponding to the temperature of the battery currently being used from the plural I-V characteristics previously stored as the candidates of the second I-V characteristic on the basis of the temperature data detected by the temperature detection means 11, and outputs this as the second I-V characteristic to the battery voltage calculation means 6 with specified load.

Incidentally, instead of selecting the I-V characteristic corresponding to the temperature of the battery currently being used (that is, at the temperature closest to the temperature of the battery currently being used), the second or the third I-V characteristic may be obtained by using I-V characteristic data at two specified temperatures higher and lower than the temperature of the battery currently being used and by performing linear approximate interpolation or the like.

The operations of the battery voltage calculation means 6 with specified load and the SOC (charging state) calculation means 7 are basically the same as the case of embodiment 1.

The battery voltage calculation means 6 with specified load uses the first I-V characteristic stored in the first I-V characteristic storage means to calculate the first battery voltage as the battery voltage when the battery current is at the specified load current value, uses the second I-V characteristic selected by the second I-V characteristic storage means to calculate the second battery voltage as the battery voltage when the battery current is at the specified load current value, and uses the third I-V characteristic selected by the second I-V characteristic storage means to calculate the third battery voltage as the battery voltage when the battery current is at the specified load current value.

The SOC (charging state) arithmetic operation means 7 uses the first, the second and the third battery voltages calculated by the battery voltage calculation means 6 with specified load and calculates the charging state of the battery in the first state.

As described above, the battery charging state arithmetic operation device according to this embodiment includes the temperature detection means 11 for detecting the temperature of the battery currently being used.

Besides, the second I-V characteristic storage means 40 previously stores the I-V characteristics at the plural specified temperatures from the high temperature to the low temperature in an operating temperature range of battery as the candidates of the third I-V characteristic, and the I-V characteristics at the plural specified temperatures as the candidates of the second I-V characteristic, and selects the characteristics corresponding to the battery temperature detected by the temperature detection means 11 from the plural stored candidates of the second I-V characteristic and the plural candidates of the third I-V characteristic as the second I-V characteristic and the third I-V characteristic, respectively.

Accordingly, according to this embodiment, the second I-V characteristic and the third I-V characteristic used by the battery voltage calculation means with specified load are the characteristics corresponding to the temperature of the battery currently being used, and the SOC (charging state) of the battery can be calculated with higher accuracy.

Embodiment 6

Figure 11:
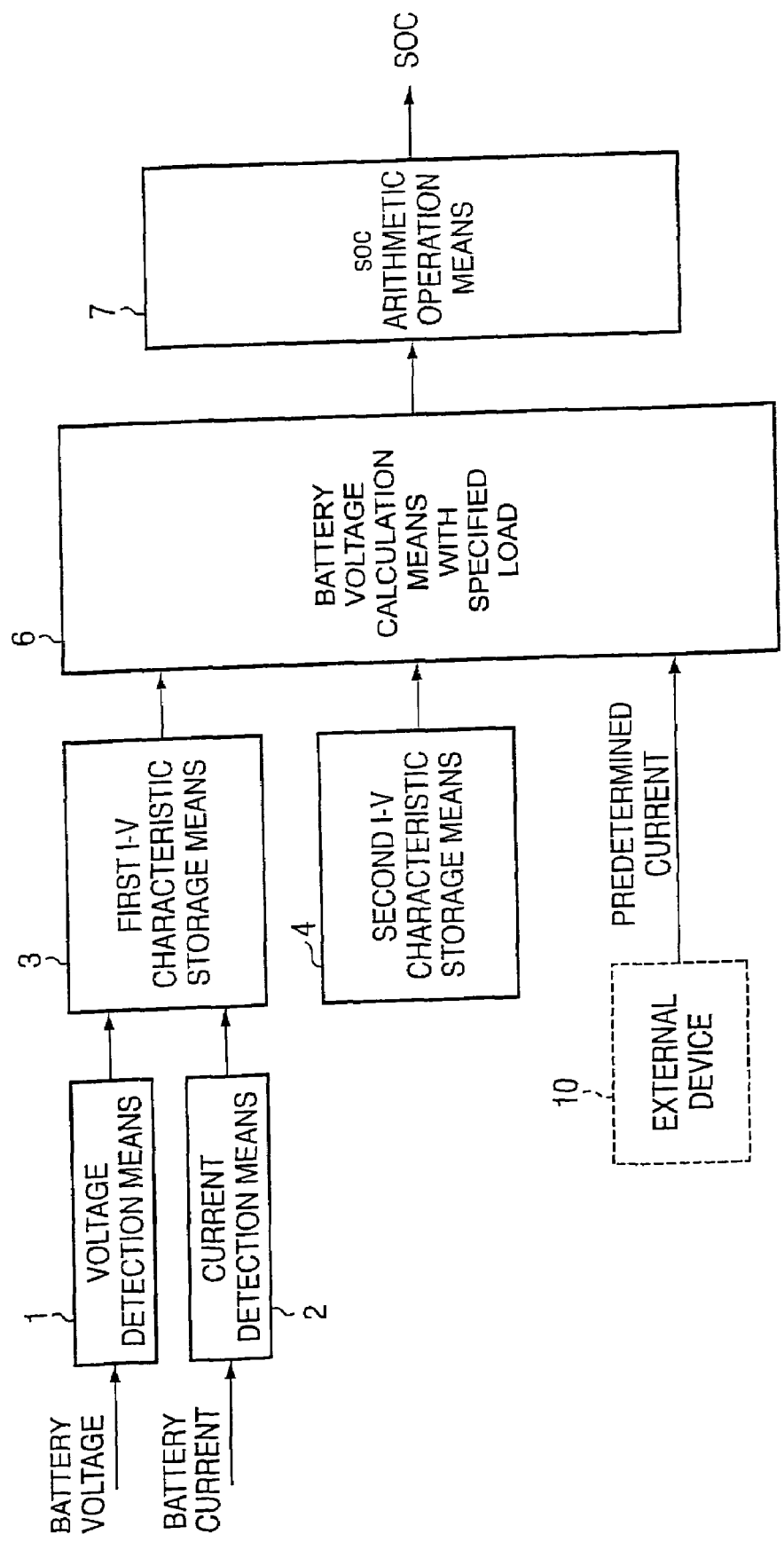
FIG. 11 is a block diagram showing a structure of a battery charging state detection device according to embodiment 6.

FIG. 11 is a block diagram showing a structure of a battery charging state arithmetic operation device according to embodiment 6.

In the battery charging state arithmetic operation device shown in FIG. 8 and according to the foregoing embodiment 1, the specified current storage means 5 is provided in the device, and the specified current value stored in this is used to calculate the battery voltage at the time of the specified load. In the battery charging state arithmetic operation device according to this embodiment, instead of the specified current storage means 5, the specified current value is set by an external device 10 provided outside the device.

Like the battery charging state arithmetic operation device according to embodiment 4, when the specified current value for calculation of the battery voltage at the time of the specified load is made to be stored in the specified current storage means 5 inside of the device, since the specified current value is fixed, the uses are limited. For example, only an application corresponding to the specified current value stored at the time of factory shipment can be treated.

On the other hand, like the battery charging state arithmetic operation device according to this embodiment, when the specified current value is made to be capable of being inputted to the battery voltage calculation means 6 with specified load from the external device, it becomes possible to make the uses have versatility. Besides, since the specified current value can be changed in real time, it can easily follow the change of the application current.

Incidentally, FIG. 11 shows the example in which in the battery charging state arithmetic operation device shown in FIG. 8 according to embodiment 4, instead of the specified current storage means 5, the external device 10 provided outside the device is used to set the specified current value. However, it is needless to say that in the battery charging state arithmetic operation device shown in FIG. 10 according to embodiment 5, instead of the specified current storage means 5, the external device 10 provided outside the device may be used to set the specified current value.

INDUSTRIAL APPLICABILITY

The invention is suitably applied to a battery charging state arithmetic operation device for detecting the state of a remaining capacity in a state where a battery used for a vehicle or the like is being used.

The invention claimed is:

1. A battery charging state arithmetic operation device, characterized by comprising:
    battery voltage detection means for detecting a voltage of a battery;
    battery current detection means for detecting a current of the battery;
    first current-voltage characteristic storage means for approximately obtaining a current-voltage characteristic of the battery in a first state as a currently used state by using voltage values and current values detected by the battery voltage detection means and the battery current detection means at plural sampling points and for storing it as a first current-voltage characteristic;
    second current-voltage characteristic storage means for previously storing a second current-voltage characteristic in a second state where amount of extractive energy is smaller than that in the first state;
    specified current value storage means for storing a specified load current value of the battery;
    battery voltage calculation means with specified load for calculating a first battery voltage when the battery current is at the specified load current value by using the first current-voltage characteristic stored in the first current-voltage characteristic storage means and for calculating a second battery voltage when the battery current is at the specified load current value by using the second current-voltage characteristic: and
    charging state arithmetic operation means for calculating a charging state of the battery in the first state by using the first and the second battery voltages calculated by the battery voltage calculation means with specified load.

2. A battery charging state arithmetic operation device according to claim 1, characterized in that the battery charging state calculated by the battery charging state arithmetic operation means is corrected according to a performance level of the battery detected by using performance level detection means from a voltage Vc in the first current-voltage characteristic storage means at the time of the specified load current stored in the specified load current storage means and a voltage Vo in the first current-voltage characteristic storage means when a load current is zero.

3. A battery charging state arithmetic operation device according to claim 2, characterized in that the battery charging state is a remaining capacity which the battery can discharge before the battery voltage is lowered from the first battery voltage to the second battery voltage.

4. A battery charging state arithmetic operation device according to claim 3, characterized in that a correction gain consistent with a characteristic of the battery is obtained by performance level correction gain calculation means from the performance level of the battery detected by the performance level detection means, the remaining capacity calculated by the battery charging state arithmetic operation device is divided by a maximum battery capacity of the battery corrected by the correction gain, and the battery charging state is calculated.

5. A battery charging state arithmetic operation device according to claim 4, characterized in that a current integration value obtained by current integrating means initialized at a time of execution of the battery charging state arithmetic operation means is added to or subtracted from the remaining capacity recited in claim 4, and the battery charging state is calculated.

6. A battery charging state arithmetic operation device according to claim 5, characterized in that from the current obtained by the battery current detection means, the current integration value obtained by the current integrating means provided with means initialized at the time of execution of the battery charging state arithmetic operation means is made to pass through a limiter having the battery charging state as an upper limit and is made to pass through a limiter having a lower limit value obtained by subtracting the maximum battery capacity from the battery charging state.

7. A battery charging state arithmetic operation device comprising:
   battery voltage detection means for detecting a voltage of a battery;
   battery current detection means for detecting a current of the battery;
   first current-voltage characteristic storage means for approximately obtaining a current-voltage characteristic of the battery in a first state as a currently used state by using voltage values and current values detected by the battery voltage detection means and the battery current detection means at plural sampling points and for storing it as a first current-voltage characteristic;
   second current-voltage characteristic storage means for previously storing a third current-voltage characteristic in a third state where the amount of extractive energy is larger than that in the first state and a second current-voltage characteristic in a second state where the amount of extractive energy is smaller than that in the first state;
   specified current value storage means for storing a specified load current value of the battery;
   battery voltage calculation means with specified load for calculating a first battery voltage when the battery current is at the specified load current value by using the first current-voltage characteristic stored in the first current-voltage characteristic storage means, for calculating a second battery voltage when the battery current is at the specified load current value by using the second current-voltage characteristic, and for calculating a third battery voltage when the battery current is at the specified load current value by using the third current-voltage characteristic: and
   charging state arithmetic operation means for calculating a charging state of the battery in the first state by using the first, the second and the third battery voltages calculated by the battery voltage calculation means with specified load.

8. A battery charging state arithmetic operation device according to claim 7, characterized in that the third state is a completely charged state, and the second state is a deep discharge state.

9. A battery charging state arithmetic operation device according to claim 7, further comprising temperature detection means for detecting a temperature of the battery currently being used, characterized in that the second current-voltage characteristic storage means previously stores, as candidates of the second current-voltage characteristic, current-voltage characteristics at plural specified temperatures from a high temperature to a low temperature in an operating temperature range of battery, and stores, as candidates of the third current-voltage characteristic, current-voltage characteristics at the plural specified temperatures, and selects, as the second current-voltage characteristic and the third current-voltage characteristic, characteristics corresponding to the battery temperature detected by the temperature detection means from the plural stored candidates of the second current-voltage characteristic and the plural candidates of the third current-voltage characteristic.

10. A battery charging state arithmetic operation device according to any one of claims 7 to 9, characterized in that the charging state arithmetic operation means calculates a ratio of a difference between the first battery voltage and the second battery voltage to a difference between the third battery voltage and the second battery voltage.

11. A battery charging state arithmetic operation device according to any one of claims 7 to 9, characterized in that the specified load current value of the battery is directly inputted to the battery voltage calculation means with specified load from an external device.

12. A battery charging state arithmetic operation method, characterized by comprising:
   a step of detecting voltage values and current values of a battery in a first state as a currently used state at plural sampling points;
   a step of approximately obtaining a current-voltage characteristic of the battery in the first state by using the voltage values and the current values of the battery detected at the plural sampling points and storing it as a first current-voltage characteristic;
   a step of previously storing the third current-voltage characteristic in a third state where the amount of extractive energy is larger than that in the first state and the second current-voltage characteristic in a second state where the amount of extractive energy is smaller than that in the first state;
   a step of storing a specified load current value of the battery;
   a step of calculating a first battery voltage when the battery current is at the specified load current value by using the first current-voltage characteristic, calculating a second battery voltage when the battery current is at the specified load current value by using the second current-voltage characteristic, and calculating a third battery voltage when the battery current is at the specified load current value by using the third current-voltage characteristic: and
   a step of calculating a charging state of the battery in the first state by using the first, the second and the third battery voltages calculated.

13. A battery charging state arithmetic operation method according to claim 12, characterized in that the third state is a completely charged state, and the second state is a deep discharge state.

14. A battery charging state arithmetic operation method according to claim 12 or 13, characterized in that at the step of calculating the battery charging state, a ratio of a difference between the first battery voltage and the second battery voltage to a difference between the third battery voltage and the second battery voltage is calculated.

* * * * *

UNITED STATES PATENT AND TRADEMARK OFFICE
CERTIFICATE OF CORRECTION

PATENT NO. : 7,323,848 B2  Page 1 of 1
APPLICATION NO. : 10/538268
DATED : January 29, 2008
INVENTOR(S) : Shinji Fujihara et al.

It is certified that error appears in the above-identified patent and that said Letters Patent is hereby corrected as shown below:

Title Page, Item (73) Assignee: Should Read,
(73)  Assignee: [Japan Storage Battery Co., Ltd., Kyoto, JAPAN; Mitsubishi Denki Kabushiki Kaisha, Tokyo, JAPAN] --GS YUASA CORPORATION, Kyoto, JAPAN and MITSUBISHI DENKI KABUSHIKI KAISHA, Tokyo, JAPAN--

Signed and Sealed this

Twentieth Day of January, 2009

JON W. DUDAS
*Director of the United States Patent and Trademark Office*